(12) United States Patent
Luoh et al.

(10) Patent No.: US 7,951,707 B2
(45) Date of Patent: May 31, 2011

(54) ETCHING METHOD FOR SEMICONDUCTOR ELEMENT

(75) Inventors: Tuung Luoh, Taipei (TW); Ling-Wuu Yang, Hsinchu (TW); Kuang-Chao Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 275 days.

(21) Appl. No.: 11/723,597

(22) Filed: Mar. 21, 2007

(65) Prior Publication Data

US 2008/0233735 A1 Sep. 25, 2008

(51) Int. Cl.
*H01L 21/4763* (2006.01)
(52) U.S. Cl. ........................ 438/636; 438/626
(58) Field of Classification Search .................. 438/626, 438/636
See application file for complete search history.

(56) References Cited

U.S. PATENT DOCUMENTS

| | | | | |
|---|---|---|---|---|
| 5,880,018 A | * | 3/1999 | Boeck et al. | 438/619 |
| 6,495,450 B1 | * | 12/2002 | Iyer et al. | 438/636 |
| 6,541,367 B1 | * | 4/2003 | Mandal | 438/622 |
| 6,586,820 B2 | * | 7/2003 | Yin et al. | 257/649 |
| 2008/0173976 A1 | * | 7/2008 | Stamper et al. | 257/531 |

* cited by examiner

*Primary Examiner* — Evan Pert
*Assistant Examiner* — Eduardo A. Rodela
(74) *Attorney, Agent, or Firm* — Rabin & Berdo, PC

(57) ABSTRACT

An etching method for semiconductor element is provided. The etching method includes the following procedure. First, a to-be-etched substrate is provided. Then, a silicon-rich silicon oxide (SRO) layer is formed on the to-be-etched substrate. Afterwards, an anti-reflective layer is formed on the SRO layer. Then, a patterned photo resist layer is formed on the anti-reflective layer. Afterwards, the anti-reflective layer, the SRO layer and the to-be-etched substrate is etched so as to form an opening.

21 Claims, 5 Drawing Sheets

ETCHING METHOD FOR SEMICONDUCTOR ELEMENT

BACKGROUND OF THE INVENTION

1. Field of the Invention

The invention relates in general to an etching method for semiconductor element, and more particularly to an etching method for semiconductor element using an anti-reflective layer and a hard mask.

2. Description of the Related Art

As the technology of manufacturing semiconductor device continues to shrink, the size of electronic elements continues to be reduced and element density continues to increase. Facing the trend of concentrating and reducing semiconductor elements, the photolithography and etching process for manufacturing semiconductor element is encountering huge challenges.

Take the contact hole manufacturing process of semiconductor element for example. Referring to FIG. 1, a cross-sectional view of conventionally forming a contact hole of a semiconductor element is shown. The substrate 10 includes an insulating portion 14 and a conductive portion 12. The insulating portion 14 is disposed on the conductive portion 12. After the patterned photo resist layer 16 is formed on the substrate 10, a opening 14a is formed on the insulating portion 14 corresponding to the pattern of the patterned photo resist layer 16 by the reactive ion etching (RIE) method until the conductive portion 12 at the bottom is exposed. Since the aspect ratio of the opening 14a is large, the patterned photo resist layer 16 is normally depleted under continuous ion impact during the application of the reactive ion etching method. The insulating portion 14 shielded underneath will be exposed and etched by ions, and the to-be-formed structure will be damaged. In general, damage-free structure can be obtained by means of increasing the photo resist thickness. However, photo resist will collapse as photo resist thickness is too high. The peeled part of the photo resist layer may drop into the opening or affect the precision of the etched pattern.

Besides, during the process of exposing the photo resist layer by deep ultra violet light (DUV light) for instance, the substrate under the photo resist layer reflects the deep ultra violet light, such that part of the preserved photo resist layer is undercut and the resolution of exposure is affected.

SUMMARY OF THE INVENTION

It is therefore an object of the invention to provide an etching method for semiconductor element. The hard mask formed by the anti-reflective layer and the silicon-rich silicon oxide layer is used as a mask during the manufacturing process of the reactive ion etching (RIE) method. The anti-reflective layer absorbs the light during the exposing process and avoids the occurrence of photo resist layer is undercut such that pattern resolution may be affected. The silicon-rich silicon oxide layer does not peel off even after a long duration of ion impact, so the silicon-rich silicon oxide layer can replace the photo resist layer in providing shielding and a thinner photo resist layer can be used for forming a pattern. The invention not only increases the reliability of the etching process, but also assures the completeness of the semiconductor structure.

The invention achieves the above-identified object by providing an etching method for semiconductor element. The etching method comprises the following steps. First, a to-be-etched substrate is provided. Next, a silicon-rich silicon oxide layer is formed on the to-be-etched substrate. Then, an anti-reflective layer is formed on the silicon-rich silicon oxide (SRO) layer. Afterwards, a patterned photo resist layer is formed on the anti-reflective layer. Then, the anti-reflective layer, the silicon-rich silicon oxide layer and the to-be-etched substrate are etched so as to form at least an opening The invention further achieves the above-identified object by providing an etching method for semiconductor element. The etching method includes the following steps. First, a to-be-etched substrate including an insulating portion and a conductive portion is provided, wherein the insulating portion is positioned on the conductive portion. Next, a silicon-rich silicon oxide layer is formed on the to-be-etched substrate. Then, an anti-reflective layer is formed on the silicon-rich silicon oxide layer. Next, a patterned photo resist layer is formed on the anti-reflective layer. Then, the anti-reflective layer, the silicon-rich silicon oxide layer and the insulating portion are etched to form at least a opening corresponding to the patterned photo resist layer and exposing the conductive portion. Next, a barrier layer at least contacting the conductive portion is formed. Then, a conductive layer is formed on the silicon-rich silicon oxide layer, wherein part of the conductive layer is positioned inside the opening. Afterwards, part of the conductive layer and part of the silicon-rich silicon oxide layer are removed so as to expose the insulating portion.

The invention further achieves the above-identified object by providing an etching method for semiconductor element. The etching method includes the following steps. First, a double-layered mask including a bottom layer and a top layer is formed on the to-be-etched substrate, wherein the bottom layer is a silicon-rich silicon oxide layer and the top layer is an anti-reflective layer. Next, a patterned photo resist layer is formed on the double-layered mask. Then, an opening corresponding to the patterned photo resist layer is formed on the double-layered mask.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
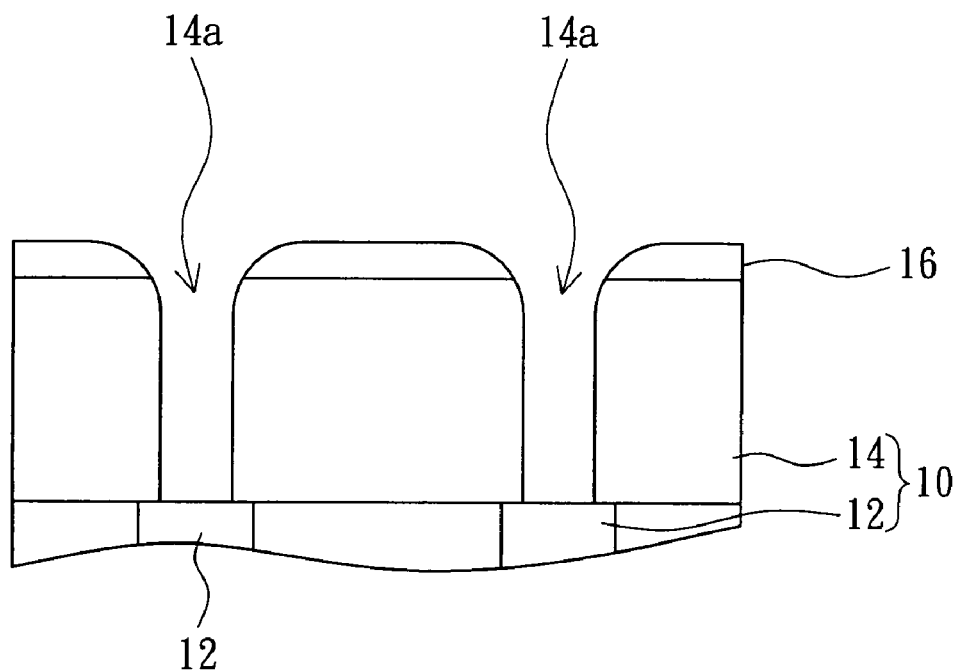
FIG. 1 is a cross-sectional view of conventionally forming a contact hole of a semiconductor element.

The embodiment of the invention of forming a contact hole of the manufacturing process of semiconductor element is disclosed below. Referring to FIGS. 2A-2F, cross-sectional views of the process of manufacturing a semiconductor element according to the invention are shown. Also referring to FIG. 3, a step flowchart of the method of manufacturing a semiconductor element according to the invention is shown. First, proceed to step 301 and refer to FIG. 2A, a to-be-etched substrate 100 including an insulating portion 140 and a conductive portion 120 is provided, wherein the insulating portion 140 is positioned on the conductive portion 140, the insulating portion 140 is made from silicon oxide ($Si_xO_y$) for instance, and examples of the conductive portion 120 include an ion-doped source or drain. Next, proceed to step 302, a silicon-rich silicon oxide (SRO) layer 174 is formed on the to-be-etched substrate 100. Then, proceed to step 303, an anti-reflective layer 172 is formed on the silicon-rich silicon oxide layer 174, wherein the anti-reflective layer 172 and the silicon-rich silicon oxide layer 174 form a double-layered mask 170. Next, proceed to step 304, after a photo resist layer is formed on the anti-reflective layer 172, a patterned photo resist layer 160 having an opening 160a is formed on the anti-reflective layer 172 via the exposing step and the developing step. The anti-reflective layer 172 reduces the reflection of the exposing light, and may adopt a dielectric anti-reflective coating (DARC) made of silicon oxynitride (SiON) to reduce the undercut problem caused by the reflection from the material under the photo resist layer. Preferably, the thickness of the anti-reflective layer 172 ranges between 100-500 Å, and the silicon-rich silicon oxide layer 174 ranges between 100-1500 Å.

Figure 2A:
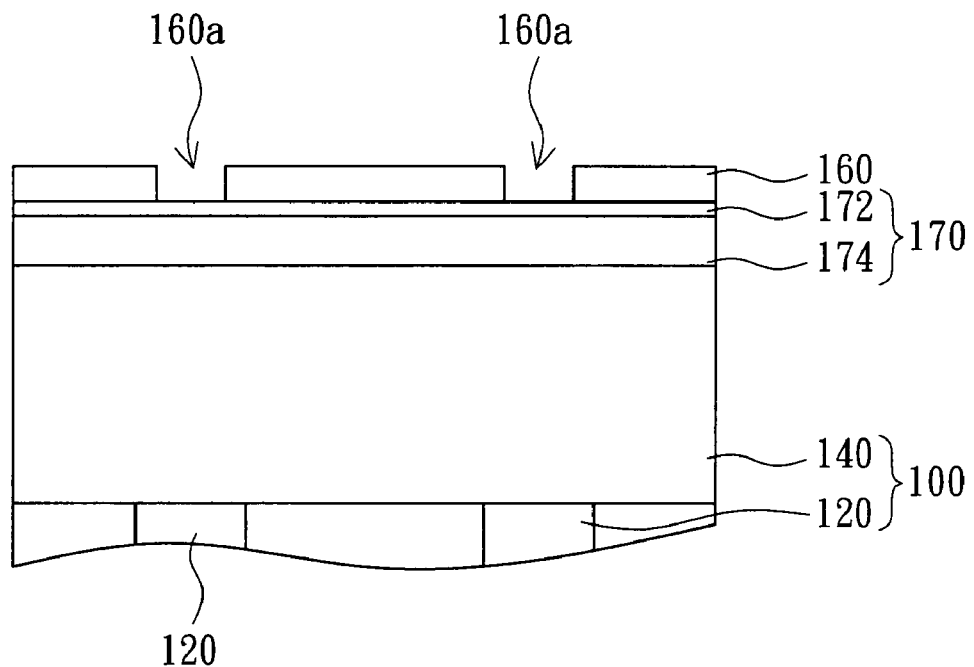
FIGS. 2A-2F are cross-sectional views of the process of manufacturing a semiconductor element according to the invention.
Figure 2B:
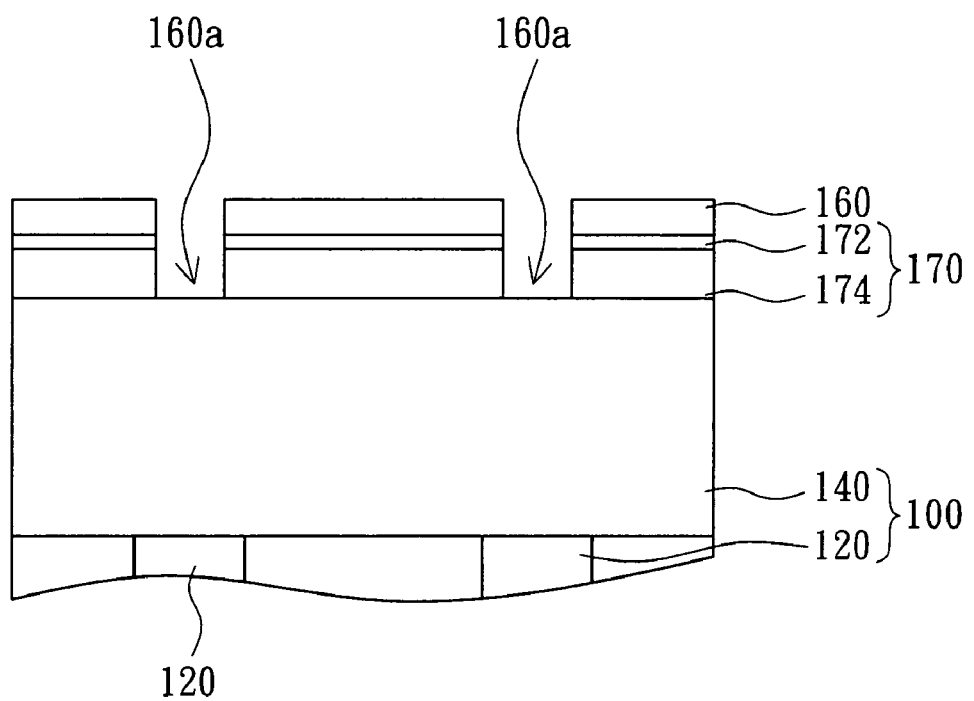
Figure 3:
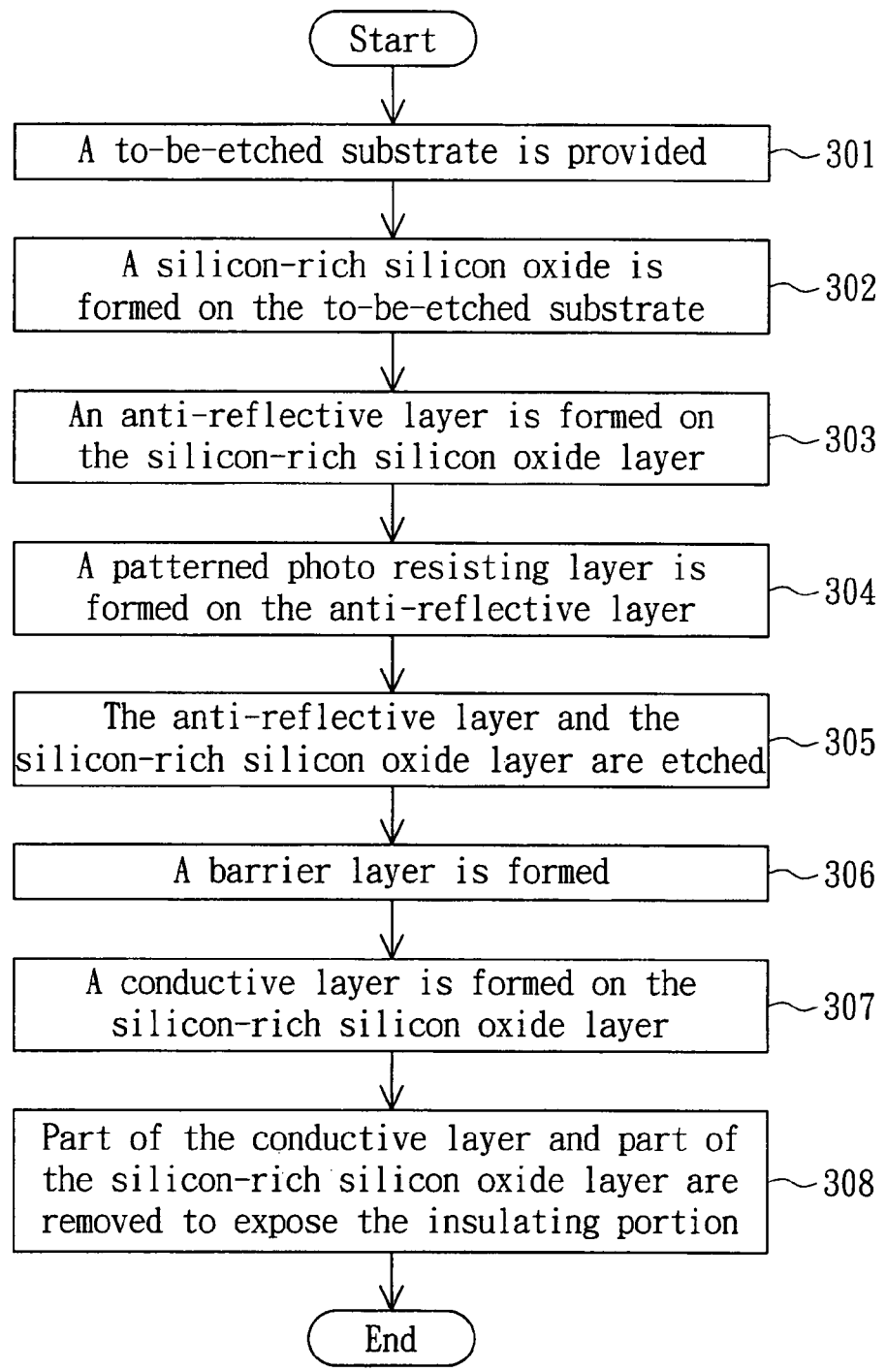
FIG. 3 is a step flowchart of the method of manufacturing a semiconductor element according to the invention.

Then, refer to FIG. 2B and proceed to step 305, the anti-reflective layer 172 and the silicon-rich silicon oxide layer 174 are etched to remove the anti-reflective layer 172 and the silicon-rich silicon oxide layer 174 exposed by the patterned photo resist layer 160 and form an opening 160a on the double-layered mask 170. The purpose of step 305 is to transfer the pattern from the patterned photo resist layer 160 to the double-layered mask 170. The silicon-rich silicon oxide layer 174 of the double-layered mask 170 has stronger resistance against the reactive ion etching and can maintain pattern precision during a long duration of ion impact. This step can be achieved by the reactive ion etching method and remove part of the insulating portion 140 by the etching process. Then, the patterned photo resist layer 160 is removed to avoid the photo resist layer from peeling off to affect etching precision during the etching process. This step can be achieved by using oxygen ash.

Figure 2C:
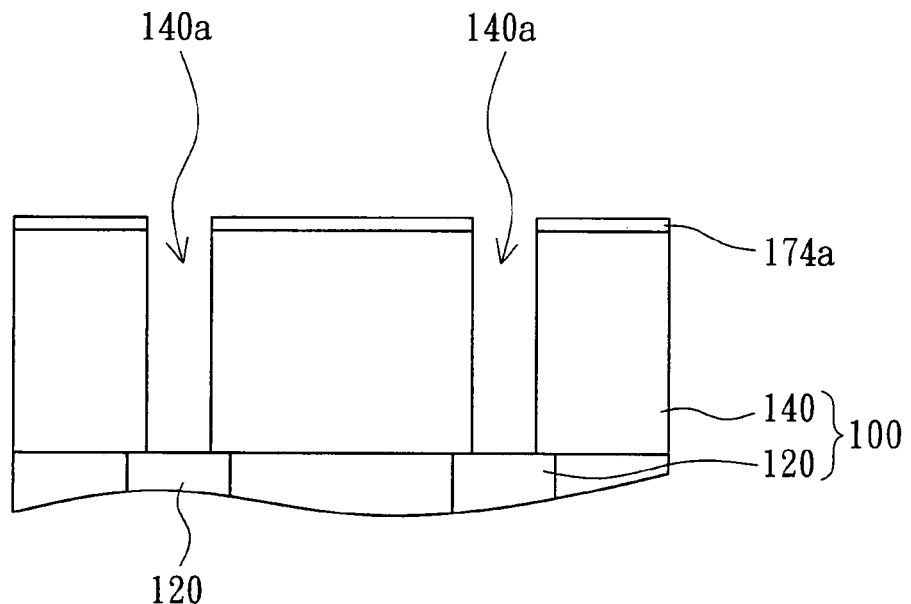

Then, refer to FIG. 2C, the insulating portion 140 is etched to form an opening 140a corresponding to the patterned photo resist layer 160 and exposing the conductive portion 120. Meanwhile, the silicon-rich silicon oxide layer 174 used as a hard mask is etched to become a thinner silicon-rich silicon oxide layer 174a by the reactive ion etching method. However, the invention is not limited to the above disclosure. For example, in step 305, the sub-step of removing the patterned photo resist layer 160 can be omitted, and the opening 140a can be directly formed by the reactive ion etching method to expose the conductive portion 120. During the contact hole manufacturing process, the depth of the opening 140a is far larger than the width of the opening 140a, and the etching method of the invention can also be applied to other structures having great aspect ratios. Further, as shown, a width of a top end of the opening is near to that of a bottom end of the opening.

Figure 2D:
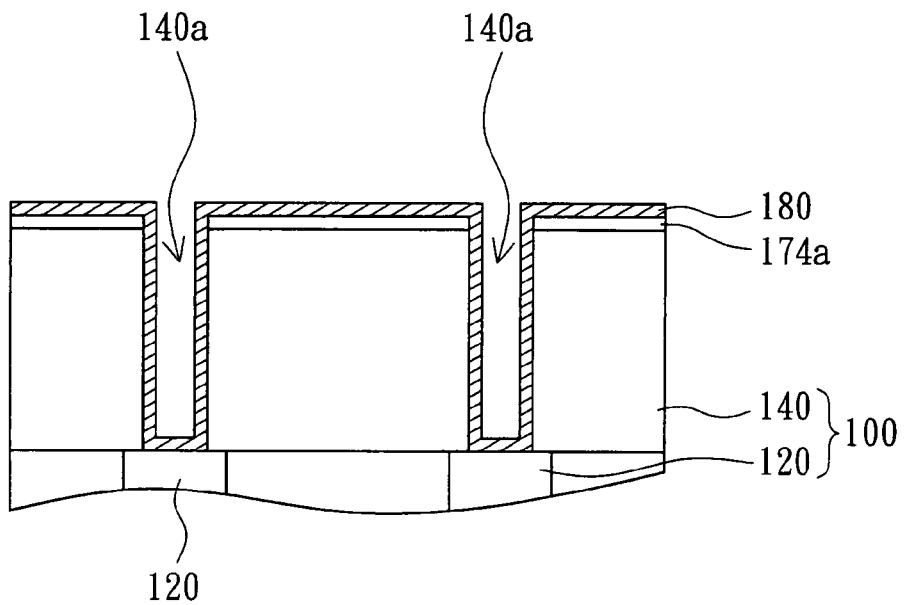

Next, refer to FIG. 2D and proceed to step 306, a barrier layer 180 at least contacting the conductive portion 120 is formed on the silicon-rich silicon oxide layer 174a and inside the opening 140a.

Figure 2E:
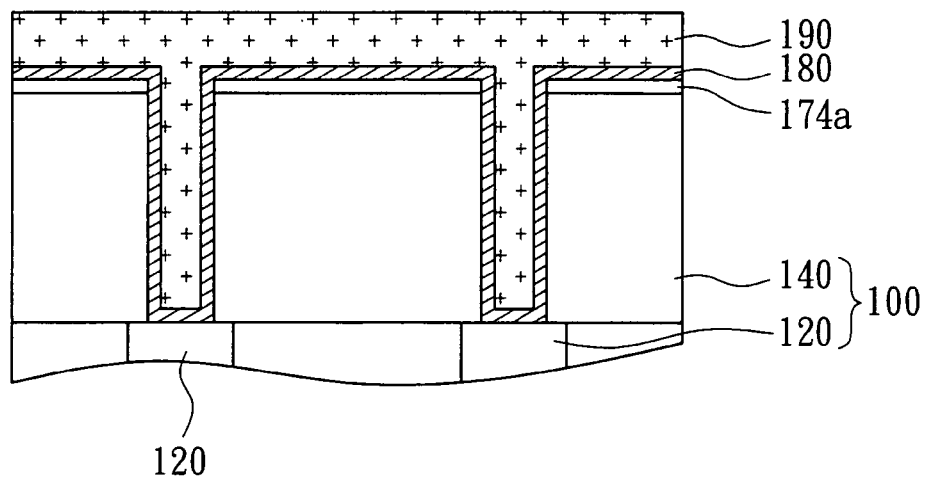

Next, refer to FIG. 2E and proceed to step 307, a conductive layer 190 is formed on the silicon-rich silicon oxide layer 174a, wherein part of the conductive layer 190 is positioned inside the opening 140a of FIG. 2D. When the conductive layer 190 is made from tungsten, the barrier layer 180 can be made from titanium (Ti) or titanium nitride (TiN). When the conductive layer 190 is made from copper, the barrier layer 180 can be made from tantalum (Ta) or tantalum nitride (TaN).

Figure 2F:
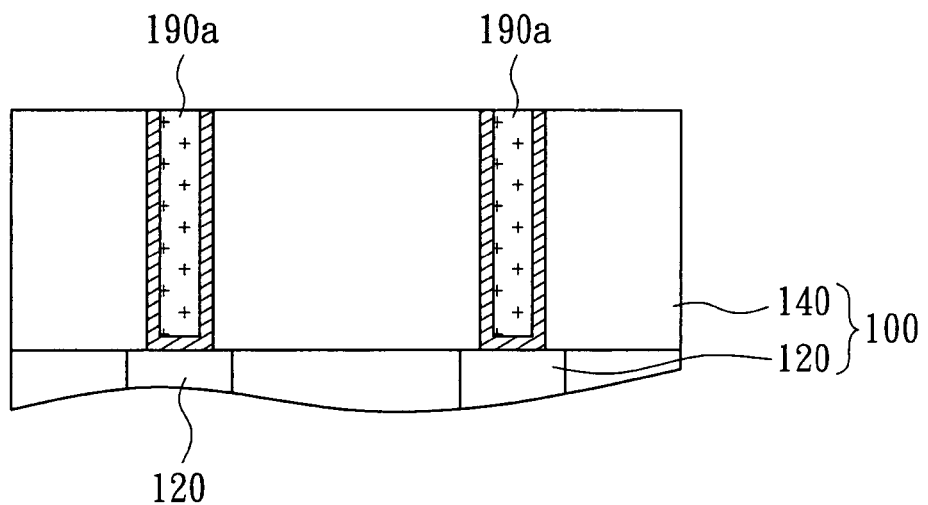

Then, refer to FIG. 2F and proceed to step 308, part of the conductive layer 190 and part of the silicon-rich silicon oxide layer 174a are removed to expose the insulating portion 140 and form contact holes 190a. When the insulating portion 140 is made from silicon oxide, the silicon-rich silicon oxide layer 174a can not be removed by phosphoric acid in conventional practice because the insulating portion 140 and the silicon-rich silicon oxide layer 174a are lacking of etching selectivity. Thus, in step 308, the redundant conductive layer 190 and the remained silicon-rich silicon oxide layer 174a can be removed by the chemical mechanical polishing (CMP) method. If the anti-reflective layer still exist, it can be removed in this step, too.

The etching method for semiconductor element disclosed in the above embodiment of the invention is adapted to the semiconductor structure having great aspect ratio, such as the contact hole. The invention uses a double-layered mask formed by the anti-reflective layer and the silicon-rich silicon oxide layer as a mask during the manufacturing process of the reactive ion etching method. The anti-reflective layer absorbs the light during the exposing process and avoids the occurrence of photo resist undercut which may affect pattern resolution. The silicon-rich silicon oxide layer does not peel off even after a long duration of ion impact, so the silicon-rich silicon oxide layer can replace the photo resist layer as a hard mask to provide shielding and the photo resist layer can become thinner. Removing the remained hard mask by the CMP method prevents the semiconductor structure from being damaged, it is more easy than the hard mask removed by conventional phosphoric acid dip. The phosphoric acid solution lacking of etching selectivity may damage the semiconductor structure. Therefore, It is not necessary to upgrade or renew the exposing apparatus or change the conditions of the etching process, this invention can form a semiconductor element with excellent line width, well control of the resolution of the high aspect ratio etching process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. An etching method for a semiconductor element, the etching method comprising:
  (a) providing a to-be-etched substrate comprising an insulating portion and a conductive portion, the insulating portion being positioned on the conductive portion;
  (b) forming a silicon-rich silicon oxide (SRO) layer on the to-be-etched substrate;
  (c) forming an anti-reflective layer on the silicon-rich silicon oxide layer;
  (d) forming a patterned photo resist layer on the anti-reflective layer;
  (e1) etching the anti-reflective layer and the silicon-rich silicon oxide layer so as to form at least a first opening corresponding to the patterned photo resist layer, the first opening only penetrating through the anti-reflective layer and the silicon-rich silicon oxide layer;
  (e2) removing the patterned photo resist layer after etching the anti-reflective layer and the silicon-rich silicon oxide layer; and
  (e3) etching the to-be-etched substrate so as to form at least a second opening exposing the conductive portion in one action, wherein the width of a top end of the second opening is near to that of a bottom end of the second opening, the width of the first opening which only penetrates through the anti-reflective layer and the silicon- rich silicon oxide layer is substantially near the width of a top end of the second opening, and the step (e3) is next to the step (e2).

2. The etching method according to claim 1, further comprising:
(g) forming a barrier layer at least contacting the conductive portion.

3. The etching method according to claim 2, wherein the barrier layer is made from titanium (Ti), titanium nitride (TiN), tantalum (Ta) or tantalum nitride (TaN).

4. The etching method according to claim 2, further comprising:
(h) forming a conductive layer on the silicon-rich silicon oxide layer, wherein part of the conductive layer is positioned inside the second opening.

5. The etching method according to claim 4, wherein the conductive layer is made from tungsten or copper.

6. The etching method according to claim 1, wherein step (e1) is achieved by the reactive ion etching (RIE) method.

7. The etching method according to claim 1, wherein the depth of the second opening is larger than the width of the second opening.

8. The etching method according to claim 1, wherein the anti-reflective layer is made from silicon oxynitride (SiON).

9. The etching method according to claim 1, wherein in the step (e2), the anti-reflective layer is also removed.

10. An etching method for a semiconductor element, the etching method comprising:
(a) providing a to-be-etched substrate comprising an insulating portion and a conductive portion, wherein the insulating portion is positioned on the conductive portion;
(b) forming a silicon-rich silicon oxide layer on the to-be-etched substrate;
(c) forming an anti-reflective layer on the silicon-rich silicon oxide layer;
(d) forming a patterned photo resist layer on the anti-reflective layer;
(e1) etching the anti-reflective layer and the silicon-rich silicon oxide layer to form at least a first opening corresponding to the patterned photo resist layer, the first opening only penetrating through the anti-reflective layer and the silicon-rich silicon oxide layer;
(e2) removing the patterned photo resist layer after etching the anti-reflective layer and the silicon-rich silicon oxide layer;
(e3) etching the insulating portion to form at least a second opening exposing the conductive portion in one action, wherein the width of a top end of the second opening is near to that of a bottom end of the second opening, the width of the first opening which only penetrates through the anti-reflective layer and the silicon-rich silicon oxide layer is substantially near the width of a top end of the second opening, and the step (e3) is next to the step (e2);

(f) forming a barrier layer at least contacting the conductive portion;
(g) forming a conductive layer on the silicon-rich silicon oxide layer, wherein part of the conductive layer is positioned inside the second opening; and
(h) removing part of the conductive layer and part of the silicon-rich silicon oxide layer so as to expose the insulating portion.

11. The etching method according to claim 10, wherein the barrier layer is made from titanium, titanium nitride, tantalum or tantalum nitride.

12. The etching method according to claim 10, wherein step (h) is achieved by the chemical mechanic polishing (CMP) method.

13. The etching method according to claim 10, wherein the conductive layer is made from tungsten or copper.

14. The etching method according to claim 10, wherein step (e1) is achieved by the reactive ion etching method.

15. The etching method according to claim 10, wherein the depth of the second opening is larger than the width of the second opening.

16. The etching method according to claim 10, wherein the anti-reflective layer is made from silicon oxynitride (SiON).

17. The etching method according to claim 10, wherein in the step (e2), the anti-reflective layer is also removed.

18. An etching method for a semiconductor element, the etching method comprising:
(a) forming a double-layered mask on a to-be-etched substrate, the double-layered mask comprising a bottom layer and a top layer, the bottom layer being a silicon-rich silicon oxide layer and the top layer being an anti-reflective layer;
(b) forming a patterned photo resist layer on the double-layered mask;
(c1) forming an opening corresponding to the patterned photo resist layer on the double-layered mask, the opening only penetrating through the double-layered mask;
(c2) removing the patterned photo resist layer after forming the opening;
(d) forming a contact hole on the to-be-etched substrate via the opening, wherein the width of a top end of the contact hole is near to that of a bottom end of the contact hole, the width of the opening which only penetrates through the double-layered mask is substantially near the width of a top end of the contact hole, and the step (d) is next to the step (c2);
wherein the step (d) is performed in one action.

19. The etching method according to claim 18, wherein the anti-reflective layer is made from silicon oxynitride (SiON).

20. The etching method according to claim 18, wherein in the step (c2), the anti-reflective layer is also removed.

21. The etching method according to claim 1, wherein in the step (e2), the anti-reflective layer is also removed.

* * * * *